United States Patent
Hayashi et al.

(10) Patent No.: US 6,743,045 B1
(45) Date of Patent: Jun. 1, 2004

(54) FLEXIBLE TRANSMISSION LINK HAVING INTEGRAL CONNECTORS

(75) Inventors: Koji Hayashi, Tachikawa (JP); Akihisa Endo, Musashimurayama (JP); Kazukuni Hisatomi, Chiba (JP); Nobukazu Kato, Fussa (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 09/705,247

(22) Filed: Nov. 2, 2000

(30) Foreign Application Priority Data

Nov. 25, 1999 (JP) .......................................... 11-334847

(51) Int. Cl.⁷ .............................................. H01R 12/24
(52) U.S. Cl. ........................ 439/495; 439/492; 439/497
(58) Field of Search ................................. 439/495, 492, 439/67, 493, 497, 499

(56) References Cited

U.S. PATENT DOCUMENTS

| | | | | |
|---|---|---|---|---|
| 3,728,661 A | * | 4/1973 | Kassabgi | 439/493 |
| 4,812,135 A | | 3/1989 | Smith | 439/493 |
| 5,037,314 A | * | 8/1991 | Bricaud et al. | 439/79 |
| 5,408,050 A | * | 4/1995 | Kashio et al. | 174/117 F |
| 6,062,900 A | * | 5/2000 | Juntwait | 439/495 |
| 6,066,000 A | * | 5/2000 | Masumoto et al. | 439/607 |
| 6,302,705 B1 | * | 10/2001 | Yatskov et al. | 439/67 |

FOREIGN PATENT DOCUMENTS

| | | | |
|---|---|---|---|
| EP | 0 476 355 A1 | 3/1992 | H01R/23/66 |
| JP | 5-65066 | 8/1993 | H01R/9/09 |
| JP | 2511926 | 7/1996 | H01R/23/68 |

OTHER PUBLICATIONS

N. Kato, "One–Touch Connectors Assure Improved Operability with Flexible Printed Circuits", Journal of Electronic Engineering, vol. 31, No. 327, Mar. 1994, pp. 94–97, XP000429336, Tokyo, JP.

* cited by examiner

Primary Examiner—Chandrika Prasad
(74) Attorney, Agent, or Firm—Michael Best & Friedrich LLP (57) ABSTRACT

In a flexible connector having a fitting portion for connection, with a counterpart connector. A plurality of flexible conductive wires (31) are arranged on a plane in parallel with each other and extend to have end portions. The flexible conductive wires are held by an insulator (8) which makes the fitting portion cooperate with the end portions of the flexible conductive wires. A flexible reinforcing member (6) is placed at one side of the plane to reinforce the flexible conductive wires and mechanically couples to the insulator.

10 Claims, 8 Drawing Sheets

FLEXIBLE TRANSMISSION LINK HAVING INTEGRAL CONNECTORS

BACKGROUND OF THE INVENTION

The present invention relates to a flexible connector for connecting two connection objects such as printed circuit boards to each other and, in particular, to a flexible connector having a flexible portion or part between the connection objects.

Various flexible connections have been disclosed in Japanese Utility Model Registration (JP-Y2) No. 2511926 and Japanese Unexamined Utility Model Publication (JP-U) No. H05-65066.

Figure 1A:
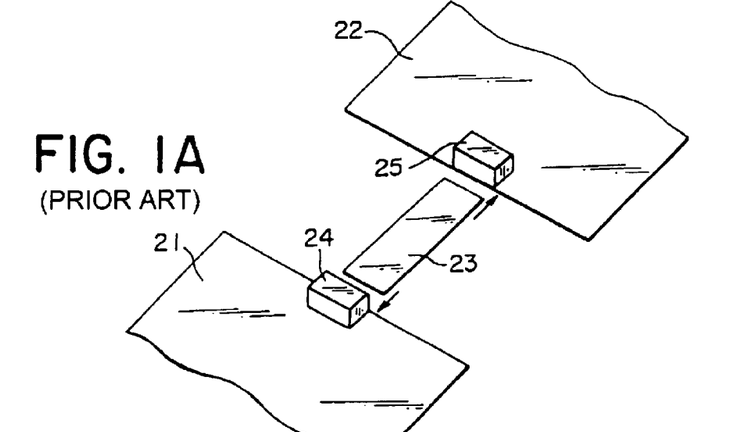
FIG. 1A is a perspective view showing an example of conventional flexible connector together with printed circuit boards.

With reference to FIG. 1A at first, an example of the flexible connections will be described. To provide flexible connection between a first printed circuit board 21 and a second printed circuit board 22, a flexible printed circuit (hereinafter referred to as "FPC") member 23 is interposed between the printed circuit boards 21 and 22. At this point, FPC connectors 24 and 25 are mounted on the printed circuit boards 21, 22, respectively. One end of the FPC 23 is connected to the FPC connector 24 and the other end of the FPC 23 is connected to the FPC connector 25.

In the flexible connector, when the FPC connectors 24, 25 are of zero-insertion-force type (hereinafter referred to as "ZIF type"), members such as sliders for the fitting/removing operation of the connectors are required and the operation of such members such as sliders is complex. When the FPC connectors 24, 25 are of Non-ZIF type, such members such as sliders and its operation are not required, but the fitting portions of the FPC 23 with the FPC connectors 24, 25 are easy,to be broken during the fitting/removing operation. Further, the FPC 23 should be manufactured as a separate part, thus increasing the cost. Moreover, since the FPC 23 and the FPC connectors 24, 25 are normally manufactured by different manufacturers, it is difficult to provide assurance for the electrical performance (for example, impedance matching).

Figure 1B:
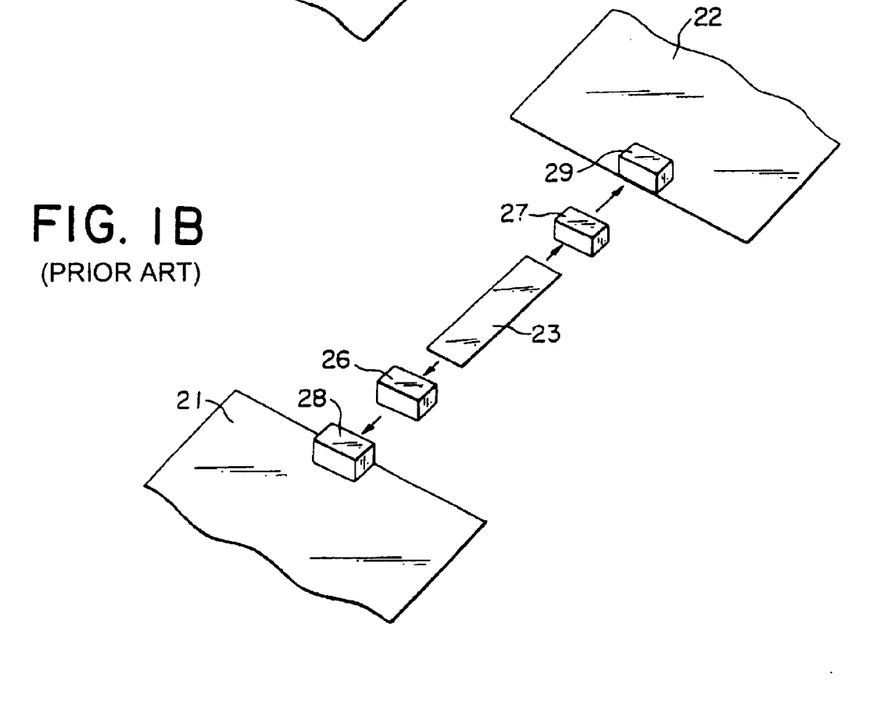
FIG. 1B is a perspective view showing another example of conventional flexible connector together with printed circuit boards.

With reference to FIG. 1B, another example of such a flexible connector will be described. To provide flexible connection between a first printed circuit board 21 and a second printed circuit board 22, a FPC 23 and two FPC relay connectors 26, 27 are interposed between the printed circuits 21 and 22. At this point, plug or receptacle connectors 28, 29 are mounted on the printed do circuit boards 21, 22, respectively. One end of the FPC 23 is connected to the plug connectors or receptacle connector 28 via the FPC relay connector 26 and the other end of the FPC 23 is connected to the plug or receptacle connector 29 via the FPC relay connector 27.

With the flexible connector, since the number of contact points is large, the possibility of malfunction and deterioration of transmission characteristics is high. The number of parts is large, thus increasing the cost. The FPC 23 should be manufactured as a separate part, thus further increasing the cost. Moreover, since the FPC 23, the FPC relay connectors 26, 27, and the plug or receptacle connectors 28, 29 are normally manufactured by different manufacturers, it is difficult to provide assurance for the electrical performance.

SUMMARY OF THE INVENTION

It is therefore an object of the present invention to provide a flexible connector integrally having a transmission line, which has a reduced number of parts, does not require complex operation, and has reduced cost, and easily allows assurance for the electrical performance.

Other objects of the present invention will become clear as the description proceeds.

A flexible connector to which the present invention is applicable has a fitting portion for being connected with a counterpart connector. The flexible connector comprises a plurality of flexible conductive wires arranged on a plane in parallel to each other and extending in a predetermined direction to have end portions, a flexible reinforcing member placed at one side of the plane to reinforce the flexible conductive wires, an insulator holding the flexible conductive wires to make the fitting portion in cooperation with the end portions of the flexible conductive wires, and coupling means connected to the insulator and the flexible reinforcing member for mechanically coupling the insulator to the flexible reinforcing member.

DESCRIPTION OF PREFERRED EMBODIMENT

With reference to FIGS. 2A through 8C, description will be made as regards a flexible connector according to an embodiment of the present invention.

Figure 2A:
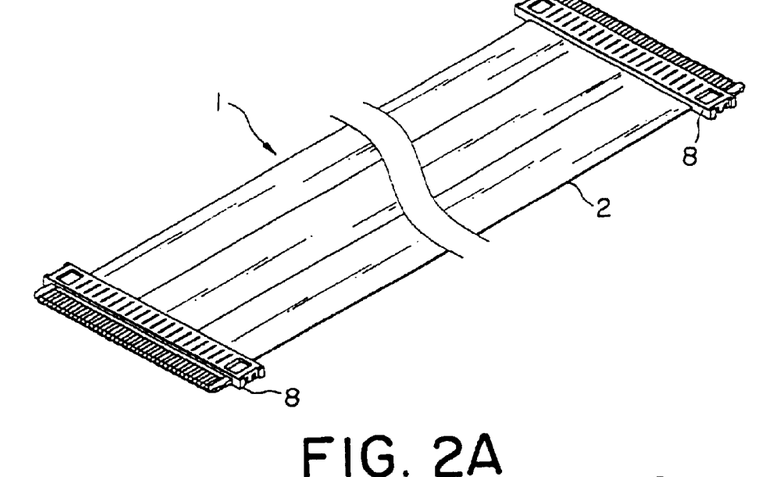
FIG. 2A is a perspective view of a flexible connector according to an embodiment of the present invention, showing its front.
Figure 2B:
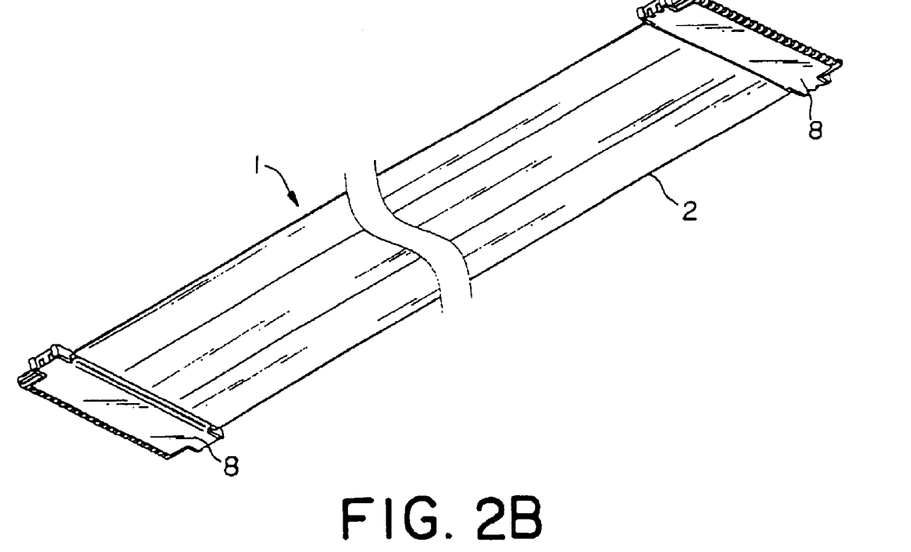
FIG. 2B is a perspective view of the flexible connector of FIG. 2A, showing its back.

In FIGS. 2A and 2B, the flexible connector is designated by numeral "1" and includes a flexible high-speed transmission line 2 and insulators 8 attached to the both ends of the length of the high-speed transmission line 2 by integral molding or insertion.

Figure 3A:
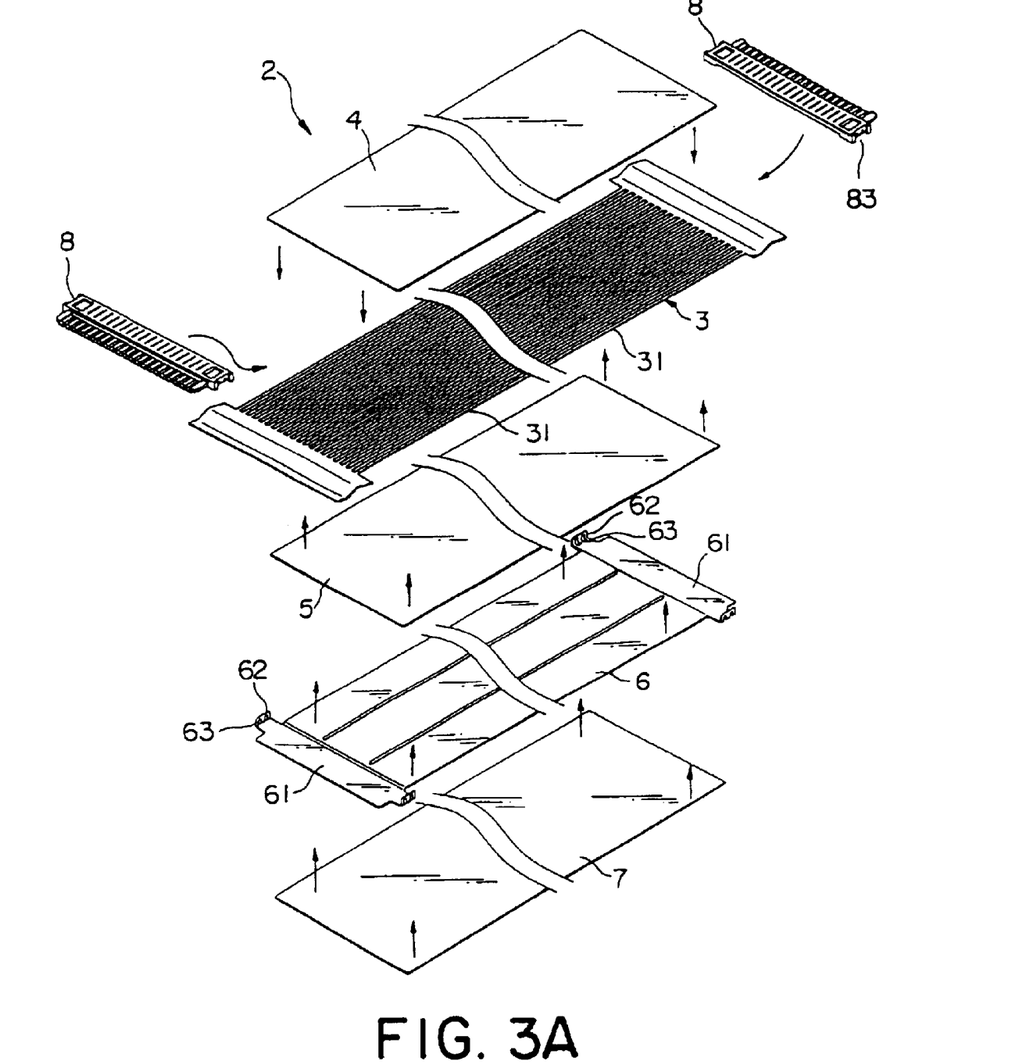
FIG. 3A is a perspective view showing the flexible connector shown in FIGS. 2A and 2B in the preassembled state.

In FIG. 3A, the high-speed transmission line 2 includes a conductor 3 manufactured by pressing or etching, an upper insulating sheet 4 attached to the front surface of the conductor 3, a middle insulating sheet 5 attached to the rear surface of the conductor 3, a thin metallic plate 6 attached as a flexible reinforcing member to the rear surface of the second insulating sheet 5, and a lower insulating sheet 7 attached to the rear surface of the metallic plate 6. The metallic plate 6 is formed with contact portions 61 at both ends in a predetermined or longitudinal direction thereof. Each of the contact portions 61 includes engaging portions 62 formed by bending both ends in a width or cross direction thereof. Each of the engaging portions 62 has a pair of L-like holes 63 formed therein. The middle insulating sheet 5 will be referred to as a first insulating sheet. The upper insulating sheet 4 will be referred to as a second insulating sheet. The lower insulating sheet 7 will be referred to as a third insulating sheet.

Figure 3B:
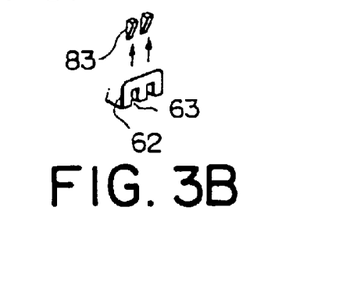
FIG. 3B is an enlarged perspective view showing the engaging structure between a metallic plate and an insulator shown in FIG. 3A.

Each of the insulators 8 is formed with a pair of claws or pawls 83 as a first engaging portion on both ends of the width thereof. When the high-speed transmission line 2 and the insulators 8 are assembled, the L-like holes 63 of the engaging portions 62 are engaged with the claws 83 of the insulators 8 as shown in FIG. 3B. Herein, the engaging portions 62 serve as a second engaging portion. A combination of the claws 83 and the engaging portion 62 is referred to as a coupling arrangement.

Figure 4A:
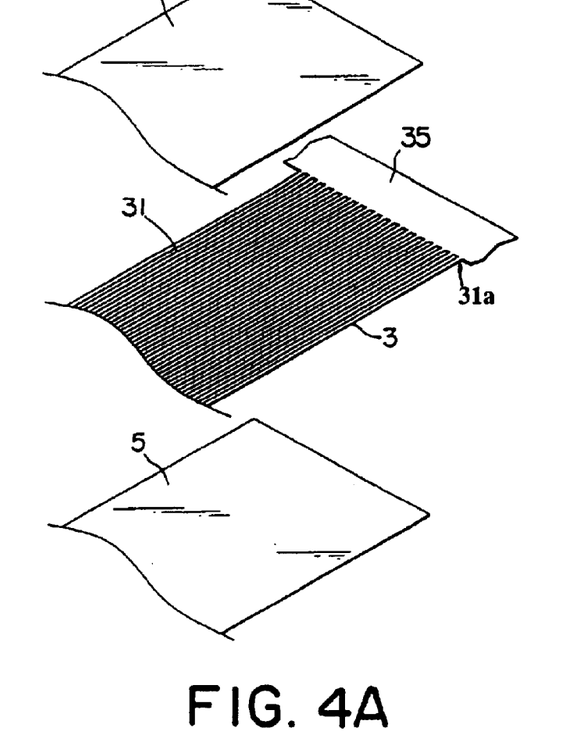
FIG. 4A is a perspective view showing a conductor and first and second insulating sheets before attachment in a first manufacturing process of the flexible connector of FIGS. 2A and 2B.
Figures 4B, 4C:
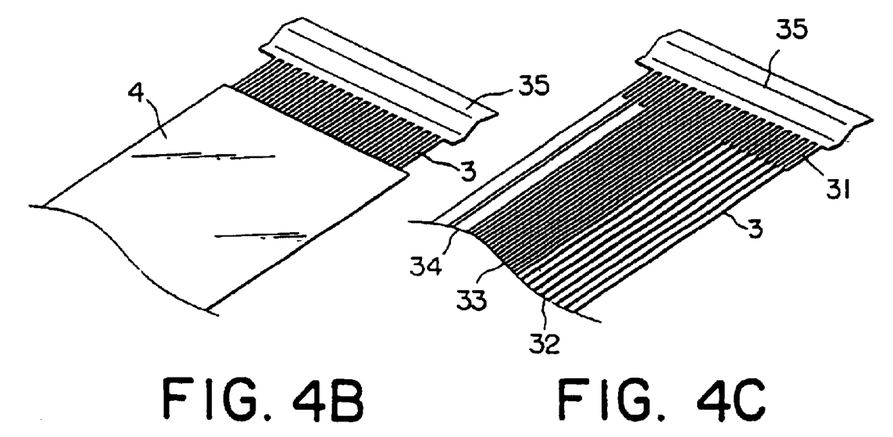
FIG. 4B is a perspective view of the conductor and the first and second insulating sheets after the attachment.
FIG. 4C is a perspective view of a conductor with a different designed pattern for the flexible connector.

Referring to FIG. 4A, the conductor 3 is previously formed with a plurality of flexible conductive wires or patterns 31 equal in width spaced at equal intervals. Each of the patterns 31 extends in the predetermined direction to have end portions 31a. Then, the first insulating sheet 4 and the second insulating sheet 5 are attached to the front surface and the rear surface of the conductor 3, respectively, is shown in FIG. 4B. It should be noted that carriers 35 are connected integrally to both ends of the conductor 3 in the longitudinal direction. For the current capacity for a power source, the impedance, and the like, one of the flexible conductive wires 31 may have different width selected according to the pin assignment.

As shown in FIG. 4C, the conductor 3 may be previously formed with a first wire group comprising a plurality of flexible conductive wires or patterns 32 of small width, a second wire group comprising a plurality of flexible conductive wires 33 of middle width, and a third wire group comprising a plurality of flexible conductive wires 34 of large width. In other words, the flexible conductive wires are grouped into a plurality of wire groups between which the flexible conductive wires have different widths.

Figure 5A:
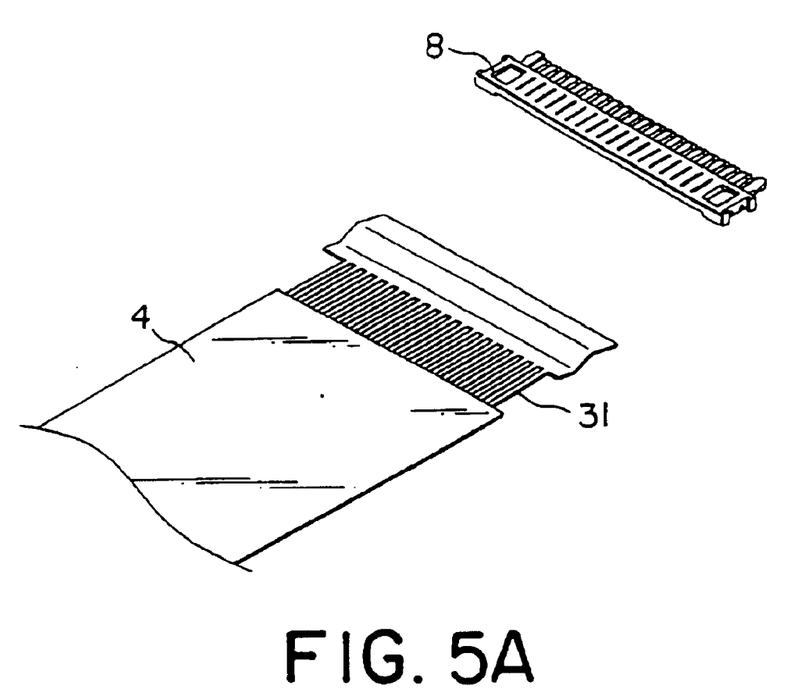
FIG. 5A is a perspective view illustrating a state before the insulator is attached to the lamination of the conductor and the first and second insulating sheets in a second manufacturing process of the flexible connector of FIGS. 2A and 2B.
Figure 5B:
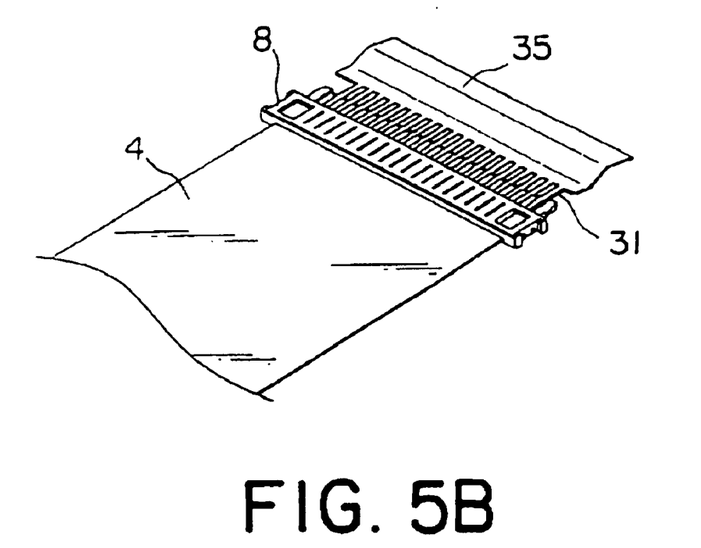
FIG. 5B is a perspective view illustrating a state after the insulator is attached to the sub-assembly.

As shown in FIG. 5A, each insulator 8 is attached to the pattern of wires. The attached state is shown in FIG. 5B.

Figure 6A:
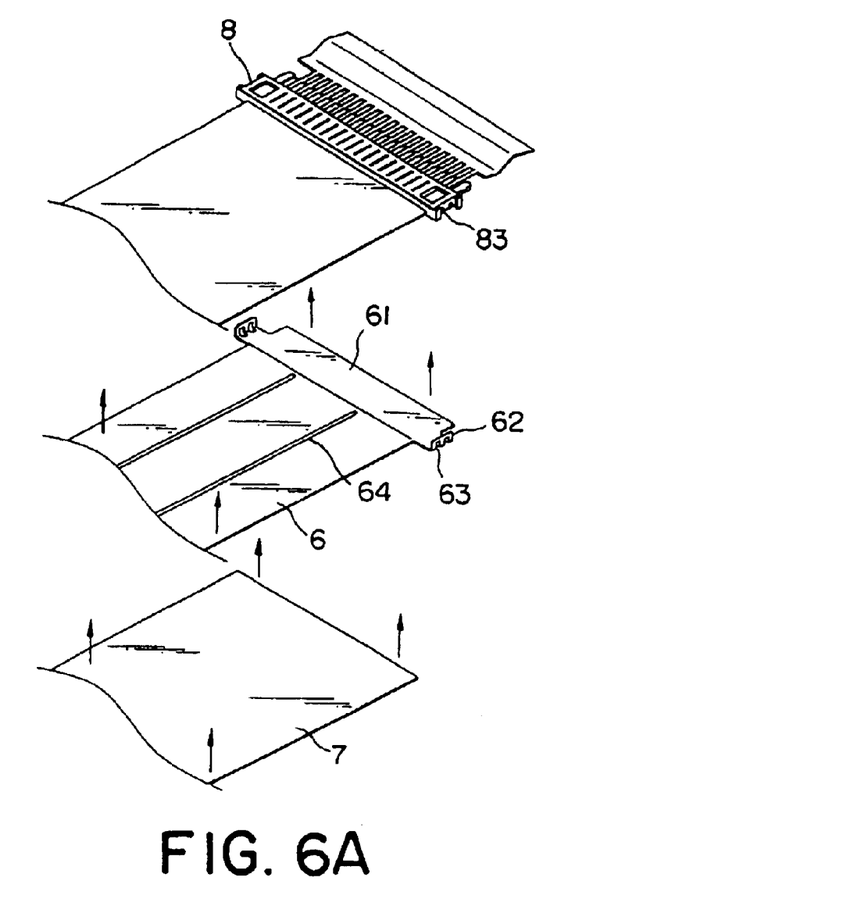
FIG. 6A is a perspective view illustrating a state before the metallic plate is attached to the second insulating sheet and a third insulating sheet is attached to the metallic plate in a third manufacturing process of the flexible connector of FIGS. 2A and 2B.
Figure 6B:
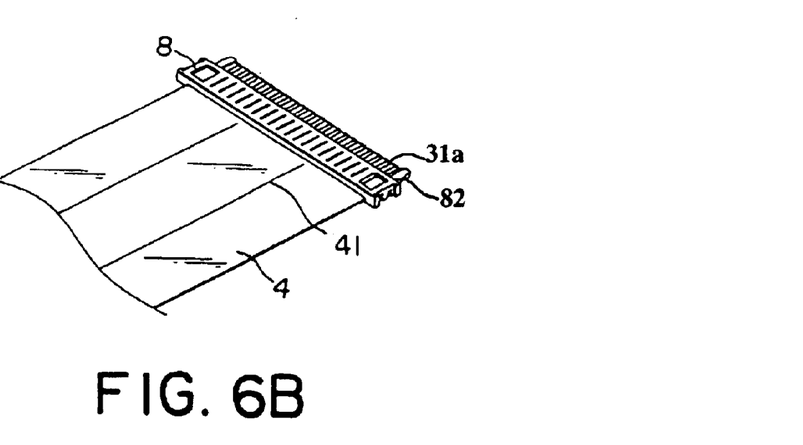
FIG. 6B is a perspective view showing a portion of the flexible connector of FIGS. 2A and 2B in the completed state.

Referring to FIG. 6A, two elongated holes 64 are previously formed in the metallic plate 6 to extend along the length of the metallic plate 6. The width of each elongated hole 64 is slightly larger than the width of each slit 41 formed in the upper, the middle, and the lower insulating sheets 4, 5, and 7 as described later. In the state shown in FIG. 6A, the front surface of the metallic plate 6 is attached to the rear surface of the middle insulating sheet 5 and the pairs of L-like holes 63 of the metallic plate 6 are engaged with the pairs of pawls 83 of the respective insulators 8. Further, the lower insulating sheet 7 is attached to the rear surface of the metallic plate 6. The carriers 35 and parts of the pattern 31 near the carriers 35 of the conductor 3 are cut and removed. After that, two slits 41 are cut or formed in the lamination of the upper insulating sheet 4, the conductor 3, the middle insulating sheet 5, the metallic plate 6, and the lower insulating sheet 7 by a cutter. At this point, the edge of the cutter is placed to a portion between one wire of the pattern 31 and the adjacent one of the pattern 31 and in the each elongated hole 64 of the metallic plate 6. As a result of this, the process of manufacturing the connector 1 is accomplished. This state of the connector 1 is shown in FIG. 68. The slits 41 are formed in the upper, the middle, and the lower insulating sheets 4, 5, and 7 and improve the flexibility of the high-speed transmission line 2.

Figure 7A:
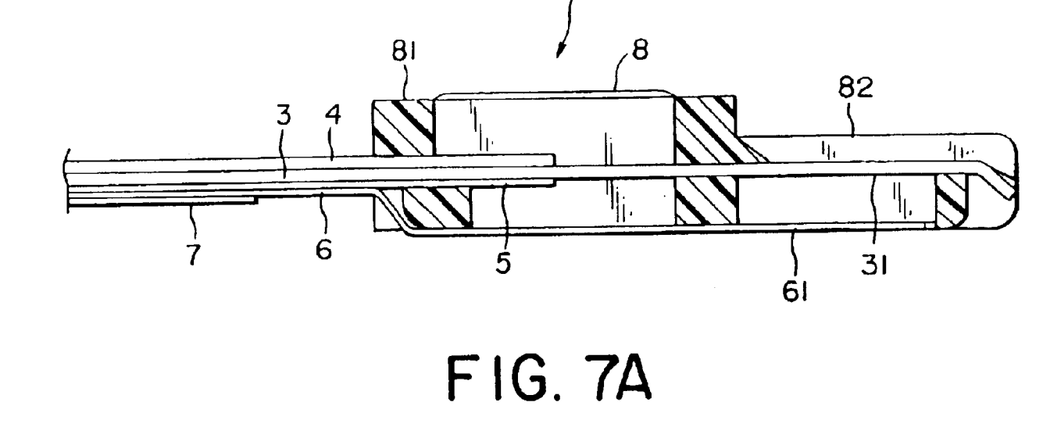
FIG. 7A is a sectional view showing main parts of the flexible connector of FIGS. 2A and 2B.

With reference to FIG. 7A, the description will be continued. The conductor 3, the A upper insulating sheet 4, and the middle insulating sheet 5 are held and secured to a body 81 of each insulator 8. Further, the end portions 31a of the patterns 31 of the conductor 3 is held and secured to each insulator 8. Thus, each insulator 8 is cooperated with the end portions 31a of the patterns 31 and with a contact portion 61 of the metallic plate 6 to make a fitting portion 82 for being connected with a counterpart connector or a relative connector 11 illustrated in FIG. 7B. Each engaging portion 62 of the metallic plate 6 is engaged with each insulator 8 so that the metallic plate 6 and the insulators 8 are integrated. The metallic plate 6 is provided at its ends with the contact portions 61 (see FIG. 3A) which serve as ground parts and come in contact with a plurality of ground contacts of a counterpart connector.

Figure 7B:
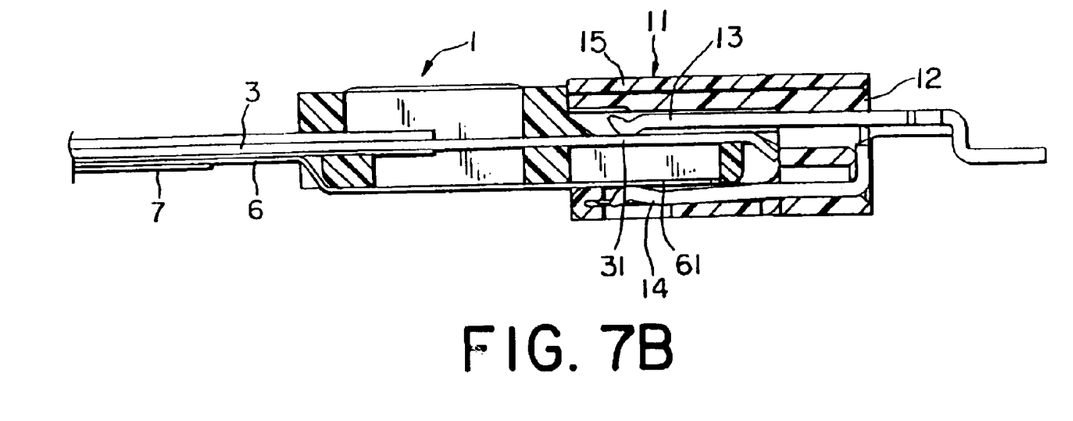
FIG. 7B is a sectional view showing the main parts of the flexible connector of FIGS. 2A and 2B in the fitted state with a relative connector.

As shown in FIG. 7B, the relative connector 11 includes an insulator 12, a plurality of signal contacts 13 and ground contacts 14 aligned on the insulator 12 for press engaging, and a shell 15 covering the insulator 12 and held by the insulator 12. In the state shown in FIG. 7B, the pattern 31 at the end of the contact 3 of the flexible connector 1 is in contact with the respective signal contacts 13 of the relative connector 11 and the contact portion 61 of the metallic plate 6 is in contact with the respective ground contacts 14 of the relative connector 11.

Figure 8A:
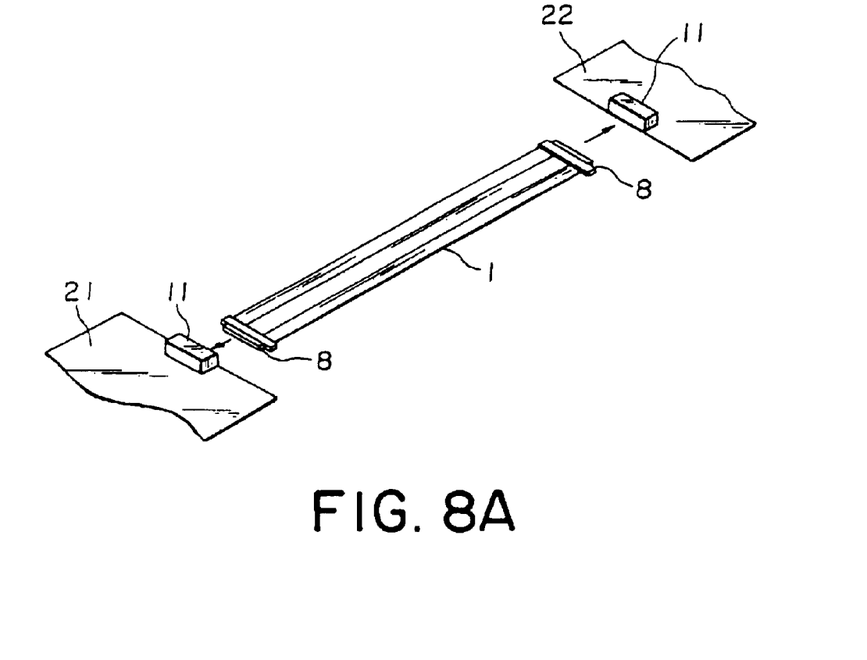
FIGS. 8A, 8B, and 8C are perspective views showing examples of usage of the flexible connector of FIGS. 2A and 2B, respectively.
Figure 8B:
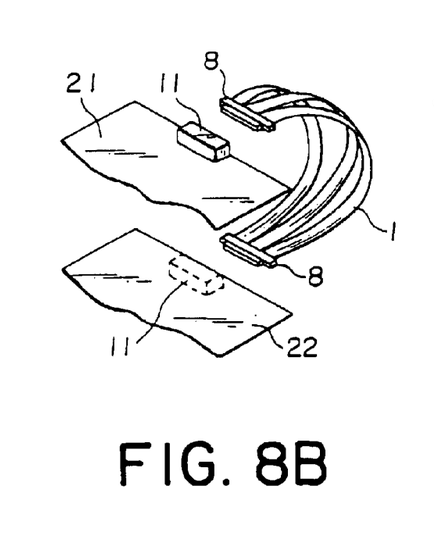
Figure 8C:
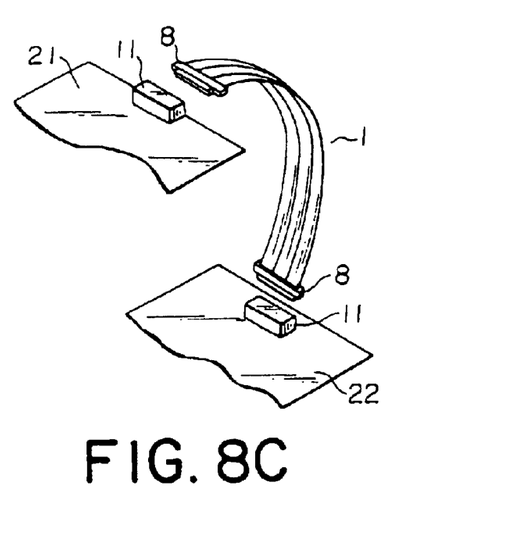

FIG. 8A shows a case that the first printed circuit board 21 and the second printed circuit board 22 are at the same level. FIG. 8B shows a case that the both circuit boards 21 and 22 are at different levels and are disposed such that the respective rear surfaces of the circuit boards 21 and 22 face to each other. FIG. 8C shows a case that the both circuit boards 21 and 22 are at different levels and are disposed such that the rear surface of the first printed circuit board 21 faces to the front surface of the second printed circuit board 22.

As apparent from the above description, the aforementioned flexible connector 1 exhibits the following effects:

1. The insulators having fitting portions and the transmission line are integrated, thereby enabling the process production and thus easily allowing the assurance for the electrical performance (for example, impedance matching).
2. The removal between the connector and the transmission line is prevented, thereby eliminating the possibility of malfunction due to the removal. No stubbing effect is occurred, thereby facilitating the matching of impedance. The ground portions can have improved air tightness and improved function. The flexible connector can have improved resistance against load produced by wrenching or the like.

3. The number of parts is reduced and the number of steps in the manufacturing process is also reduced, thereby reducing the cost.

4. When the flexible connector is structured to have the same fitting portions and the conductor with different patterns, the flexible connector can provide connection of different modes even with the same relative connector.

What is claimed is:

1. A flexible connector having a fitting portion for being connected with a counterpart connector having a plurality of signal contacts and a ground contact, said flexible connector comprising:

a plurality of flexible conductive wires arranged on a plane in parallel to each other and extending in a predetermined direction to have end portions;

a flexible reinforcing metallic plate member placed at one side of said plane to reinforce said flexible conductive wires, said flexible reinforcing member having a contact portion;

an insulator holding said flexible conductive wires and said flexible reinforcing metallic plate member to make said fitting portion in cooperation with said end portions and said contact portion;

a first insulating sheet placed between each of said flexible conductive wires and said flexible reinforcing member for insulating said flexible conductive wires from said reinforcing member; and coupling means connected to said insulator and said flexible reinforcing metallic plate member for mechanically coupling said insulator and said flexible conductive wires to said flexible reinforcing metallic plate member, said end portions and said contact portion being brought into contact with said signal contacts and said ground contact, respectively, when said fitting portion is connected with said counterpart connector, said coupling means comprising:

a first engaging portion connected to said flexible reinforcing member; and a second engaging portion connected to said insulator for engaging with said first engaging portion to integrate said insulator with said flexible reinforcing member.

2. A flexible connector as claimed in claim 1, wherein said first insulation sheet has at least one elongated slit extending in said predetermined direction.

3. A flexible connector as claimed in claim 1, wherein said flexible reinforcing member is made of a metallic plate.

4. A flexible connector as claimed in claim 1, wherein said flexible reinforcing member has at least one elongated slit extending in said predetermined direction.

5. A flexible connector as claimed in claim 1 wherein said counterpart connector includes a ground contact, said flexible reinforcing member having a ground part for coming in contact with said ground contact.

6. A flexible connector as claimed in claim 1, further comprising a second insulating sheet placed at the other side of said plane to cover said flexible conductive wires.

7. A flexible connector as claimed in claim 6, wherein said second insulation sheet has at least one elongated slit extending in said predetermined direction.

8. A flexible connector as claimed in claim 1, further comprising a third insulating sheet placed on said flexible reinforcing member to cover said flexible reinforcing member.

9. A flexible connector as claimed in claim 8, wherein said second insulation sheet has at least one elongated slit extending in said predetermined direction.

10. A flexible connector as claimed in claim 1, wherein said flexible conductive wires are grouped into a plurality of wire groups between which said flexible conductive wires have different widths.

* * * * *